(12) United States Patent  
Shin et al.

(10) Patent No.: US 12,550,683 B2  
(45) Date of Patent: Feb. 10, 2026

(54) SEMICONDUCTOR PACKAGES HAVING TEST PADS

(71) Applicant: Samsung Electronics Co., Ltd., Suwon-si (KR)

(72) Inventors: Joongwon Shin, Suwon-si (KR); Jongmin Lee, Suwon-si (KR); Sungyun Woo, Suwon-si (KR); Nara Lee, Suwon-si (KR); Yeonjin Lee, Suwon-si (KR); Jimin Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 334 days.

(21) Appl. No.: 18/210,114

(22) Filed: Jun. 15, 2023

(65) Prior Publication Data

US 2024/0145317 A1     May 2, 2024

(30) Foreign Application Priority Data

Nov. 1, 2022    (KR) .................. 10-2022-0143844

(51) Int. Cl.  
*H01L 21/66* (2006.01)  
*G01R 31/28* (2006.01)  
(Continued)

(52) U.S. Cl.  
CPC .......... *H01L 22/32* (2013.01); *G01R 31/2896* (2013.01); *H01L 23/481* (2013.01); *H01L 24/05* (2013.01); *H01L 25/18* (2013.01); *H01L 25/50* (2013.01); *H10B 80/00* (2023.02); *H01L 24/06* (2013.01); *H01L 24/08* (2013.01); *H01L 24/13* (2013.01); *H01L 24/16* (2013.01); *H01L 2224/05555* (2013.01); *H01L 2224/0557* (2013.01); *H01L 2224/05611* (2013.01); *H01L 2224/05616* (2013.01); *H01L 2224/05624* (2013.01); *H01L 2224/05639* (2013.01);

(Continued)

(58) Field of Classification Search  
None  
See application file for complete search history.

(56) References Cited

U.S. PATENT DOCUMENTS 8,033,012 B2    10/2011    Hsu et al.  
8,603,909 B2    12/2013    Yeo et al.  
(Continued)

FOREIGN PATENT DOCUMENTS

JP     2000232127 A    8/2000  
JP     3843624 B2    11/2006  
(Continued)

OTHER PUBLICATIONS

Extended European Search Report dated Mar. 20, 2024 for corresponding application No. EP 23206043.4.

*Primary Examiner* — Hung K Vu  
(74) *Attorney, Agent, or Firm* — Muir Patent Law, PLLC

(57) ABSTRACT

A semiconductor package, includes: a base chip having a front surface and a back surface opposite to the front surface, the base chip including bump pads, wafer test pads, and package test pads, disposed on the front surface; connection structures disposed on the front surface of the base chip and connected to the bump pads; and semiconductor chips stacked on the back surface of the base chip, wherein each of the wafer test pads is smaller than the package test pads.

20 Claims, 12 Drawing Sheets

(51) Int. Cl.
  *H01L 23/00* (2006.01)
  *H01L 23/48* (2006.01)
  *H01L 25/00* (2006.01)
  *H01L 25/18* (2023.01)
  *H10B 80/00* (2023.01)

(52) U.S. Cl.
  CPC ............... *H01L 2224/05644* (2013.01); *H01L 2224/05647* (2013.01); *H01L 2224/05655* (2013.01); *H01L 2224/05666* (2013.01); *H01L 2224/06136* (2013.01); *H01L 2224/06181* (2013.01); *H01L 2224/08145* (2013.01); *H01L 2224/13111* (2013.01); *H01L 2224/13139* (2013.01); *H01L 2224/13147* (2013.01); *H01L 2224/16225* (2013.01); *H01L 2924/014* (2013.01)

(56) References Cited

U.S. PATENT DOCUMENTS

| | | | |
|---|---|---|---|
| 8,916,875 B2 | 12/2014 | Lee | |
| 8,927,987 B2 | 1/2015 | Kondou | |
| 8,957,691 B2 | 2/2015 | Wang et al. | |
| 9,859,237 B2 | 1/2018 | Kwon et al. | |
| 10,024,907 B2 | 7/2018 | Watanabe et al. | |
| 11,393,764 B2 | 7/2022 | Nam et al. | |
| 2009/0322362 A1 | 12/2009 | Lim et al. | |
| 2010/0007001 A1* | 1/2010 | Wang | H01L 25/0657 257/E21.705 |
| 2013/0153898 A1* | 6/2013 | Takahashi | H01L 22/32 257/48 |
| 2013/0221493 A1* | 8/2013 | Kim | H01L 21/6835 257/774 |
| 2021/0407962 A1 | 12/2021 | Kim et al. | |

FOREIGN PATENT DOCUMENTS

| | | |
|---|---|---|
| JP | 4611067 B2 | 1/2011 |
| KR | 1020050075447 A | 7/2005 |
| KR | 1020100000732 A | 1/2010 |
| WO | 2004049436 A1 | 6/2004 |

\* cited by examiner

SEMICONDUCTOR PACKAGES HAVING TEST PADS

CROSS-REFERENCE TO RELATED APPLICATION

This application claims priority and benefit thereof under 35 U.S.C. § 119 to Korean Patent Application No. 10-2022-0143844, filed on Nov. 1, 2022, with the Korean Intellectual Property Office, the entire disclosure of which is incorporated herein by reference.

BACKGROUND

1. Field

The present inventive concept relates to a semiconductor package having a test pad.

2. Description of Related Art

As demands for high performance, high speed, and/or multifunctionality of semiconductor devices increase, a degree of integration of semiconductor devices is increasing. In manufacturing a semiconductor device with a fine pattern corresponding to the trend of high integration of semiconductor devices, it is required to implement patterns having a fine width or a fine separation distance. In addition, high integration of semiconductor devices mounted in a semiconductor package is required.

SUMMARY

An aspect of the present inventive concept is to provide a semiconductor package having a miniaturized test pad.

According to example embodiments, a semiconductor package may include: a base chip having a front surface and a back surface opposite to the front surface, the base chip including bump pads, wafer test pads, and package test pads disposed on the front surface thereof; connection structures disposed on the front surface of the base chip and connected to the bump pads; and semiconductor chips stacked on the back surface of the base chip. Each of the wafer test pads may be smaller than the package test pads in size.

According to example embodiments, a semiconductor package may include: a base chip having a front surface and a back surface opposite to the front surface, the base chip including bump pads, wafer test pads, and package test pads disposed on the front surface thereof; connection structures disposed on the front surface of the base chip and connected to the bump pads; and semiconductor chips stacked on the back surface of the base chip and including test pads. Each of the wafer test pads may be smaller than the package test pads and larger than or equal to the test pads in size.

According to example embodiments, a semiconductor package, may include: a base chip having a front surface and a back surface opposite to the front surface; semiconductor chips stacked on the back surface of the base chip; connection structures disposed on the front surface of the base chip; and a molded layer covering the base chip and the semiconductor chips. The base chip may include a base body; through electrodes penetrating through the base body; an internal circuit structure disposed below the base body and including internal interconnections; and a base back structure disposed on the base body. The internal circuit structure may include bump pads disposed on the front surface, wafer test pads electrically connected to at least one of the internal interconnections, and package test pads electrically connected to at least one of the semiconductor chips. Each of the wafer test pads may be smaller than the package test pads in size.

BRIEF DESCRIPTION OF DRAWINGS

The above and other aspects, features, and advantages of the present inventive concept will be more clearly understood from the following detailed description taken in conjunction with the accompanying drawings, in which.

DETAILED DESCRIPTION

Hereinafter, preferred example embodiments of the present inventive concept will be described with reference to the accompanying drawings as follows. Like numerals refer to like elements throughout.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element (or using any form of the word "contact"), there are no intervening elements present at the point of contact.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise.

Figure 1:
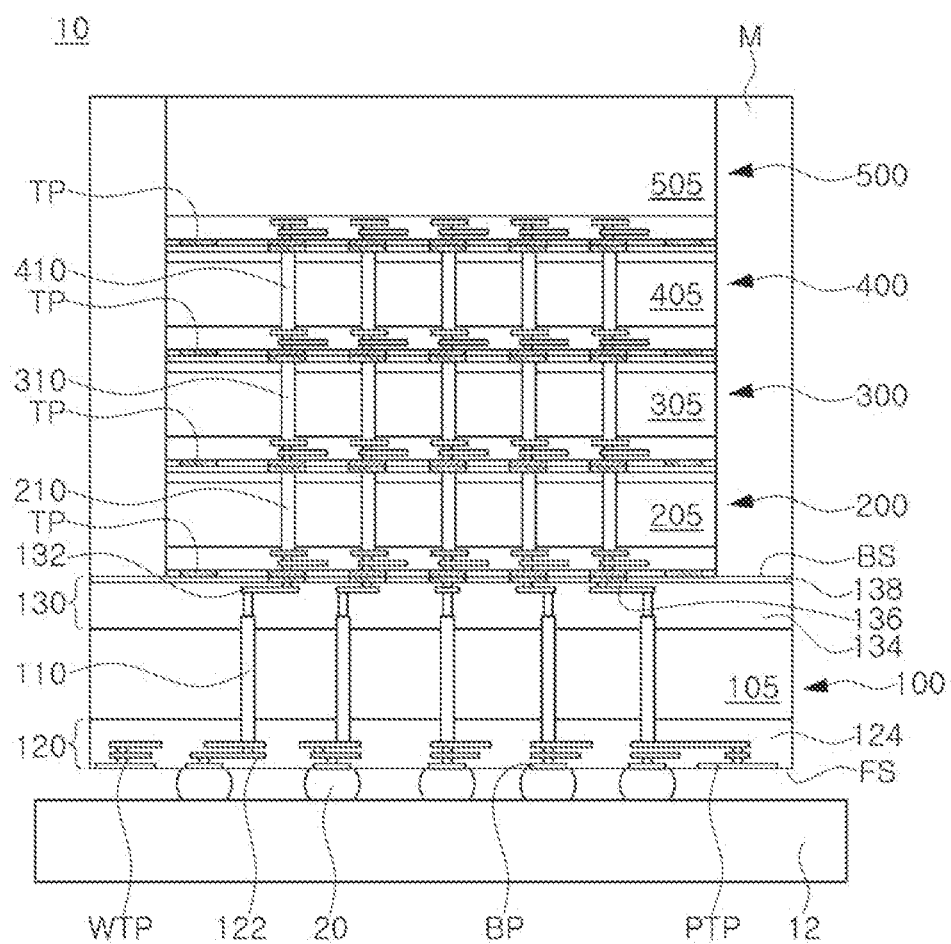
FIG. 1 is a cross-sectional view of a semiconductor package according to example embodiments.

FIG. 1 is a cross-sectional view of a semiconductor package according to example embodiments.

Figure 2:
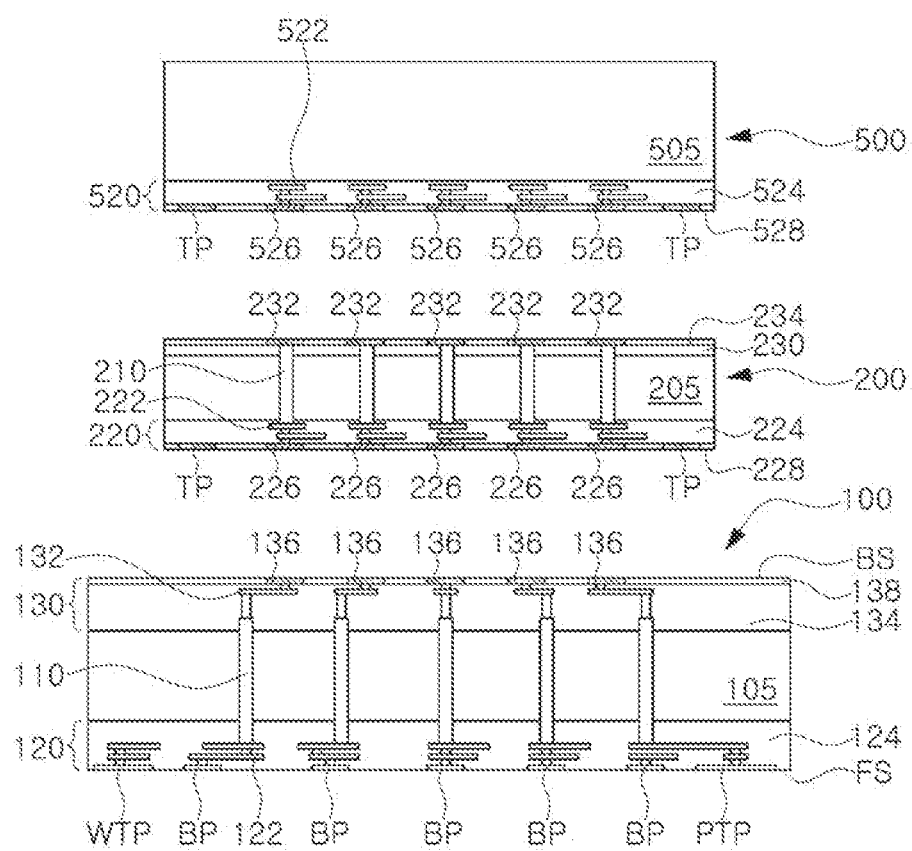
FIG. 2 are cross-sectional views illustrating some components illustrated in FIG. 1 in an exploded manner.

FIG. 2 are cross-sectional views illustrating some components shown in FIG. 1 in an exploded manner.

Referring to FIGS. 1 and 2, a semiconductor package 10 according to an example embodiment of the present disclosure may include connection structures 20, a base chip 100, and first to fourth semiconductor chips 200, 300, 400, and 500, sequentially stacked on the base chip 100, and a molded layer M. The semiconductor package 10 may be mounted on a package substrate 12 through the connection structures 20.

The semiconductor package 10 of the present disclosure may be a high bandwidth memory (HBM) package. In an example embodiment, the base chip 100 may be a different type of semiconductor chip from the first to fourth semiconductor chips 200, 300, 400, and 500. For example, the base chip 100 may be a logic chip, and the first to fourth semiconductor chips 200, 300, 400, and 500 may be memory chips. The logic chip may include a microprocessor, an analog device, or a digital signal processor. The memory chips may include a volatile memory chip such as dynamic random access memory (DRAM) or static random access memory (SRAM), or a non-volatile memory chip such as phase-change random access memory (PRAM), magnetoresistive random access memory (MRAM), ferroelectric random access memory (FeRAM), or resistive random access memory (RRAM).

The base chip 100 may be mounted on the package substrate 12 through the connection structures 20. The base chip 100 may include a base body 105, through electrodes 110, an internal circuit structure 120, and a base back surface structure 130. The base body 105 may include a semiconductor material such as a Group IV semiconductor, a Group III-V compound semiconductor, or a Group II-VI compound semiconductor. The through electrodes 110 may extend in a vertical direction, and may penetrate through the base body 105. Each of the connection structures 20 may be a solder ball or bump, and may be formed of a conductive material, such as a metal, for example.

The internal circuit structure 120 may be disposed below the base body 105, and may be connected to the connection structure 20. The internal circuit structure 120 may include internal interconnections 122, a lower insulating layer 124, bump pads BP, wafer test pads WTP, and package test pads PTP. The internal interconnections 122 may be disposed in layers, and the through electrode 110 may be electrically connected to at least one of the internal interconnections 122. In addition, the bump pads BP may be connected to at least one of the internal interconnections 122, and the package test pads PTP may be electrically connected to at least one of the internal interconnections 122.

The lower insulating layer 124 may cover a lower surface of the base body 105 and the internal interconnections 122. The lower insulating layer 124 may also partially cover side surfaces of the through electrodes 110. The bump pads BP may be exposed without being completely covered by the lower insulating layer 124. The bump pads BP may contact a connection structure 20, and electrically connect the connection structure 20 to at least one of the internal interconnections 122. A lower surface of the base chip 100 on which the bump pads BP are disposed and facing the package substrate 12 may be referred to as a front surface FS of the base chip 100.

The wafer test pads WTP may be used to determine whether the internal circuit structure 120 is defective, and may be disposed on the front surface FS of the base chip 100. The wafer test pads WTP may be buried in the lower insulating layer 124, but may be exposed without being completely covered by the lower insulating layer 124. In example embodiments, lower surfaces of the wafer test pads WTP may be coplanar with the front surface FS of the base chip 100. The wafer test pads WTP may be electrically connected to at least one of the internal interconnections 122. The wafer test pads WTP may not contact the connection structures 20.

The package test pads PTP may be used to determine whether first to fourth semiconductor chips 200, 300, 400, and 500 are defective, and may be disposed on the front surface FS of the base chip 100. The package test pads PTP may be buried in the lower insulating layer 124, but may be exposed without being completely covered by the lower insulating layer 124. In example embodiments, lower surfaces of the package test pads PTP may be coplanar with the front surface FS of the base chip 100. The package test pads PTP may be electrically connected to at least one of the first to fourth semiconductor chips 200, 300, 400, and 500 through at least one of the through electrodes 110. The package test pads PTP may not contact the connection structures 20.

According to an example embodiment of the present disclosure, the wafer test pads WTP may be formed to be smaller than the package test pads PTP. Both the wafer test pads WTP and the package test pads PTP may be formed to be larger than the bump pads BP. In addition, the wafer test pads WTP may be disposed farther from a central portion of the front surface FS of the base chip 100 than the test package pads PTP. Alternatively, a distance between the wafer test pads WTP and a side surface of the base chip 100, adjacent thereto may be smaller than a distance between the package test pads PTP and a side surface of the base chip 100 adjacent thereto.

The base back structure 130 may be disposed on the base body 105. The base back structure 130 may include an internal interconnection 132, an upper insulating layer 134, bonding pads 136, and a passivation layer 138. The internal interconnection 132 may be disposed on the through electrodes 110, and may be electrically connected to the through electrodes 110. The upper insulating layer 134 may cover an upper surface of the base body 105 and the internal interconnection 132. The upper insulating layer 134 may also partially cover side surfaces of the through electrodes 110.

The bonding pads 136 may be disposed on the upper insulating layer 134, and may be electrically connected to the through electrodes 110 through the internal interconnection 132. The passivation layer 138 may cover the upper insulating layer 134, and may cover side surfaces of the bonding pads 136. The bonding pad 136 may not be completely covered by the passivation layer 138, and upper surfaces of the bonding pads 136 may be exposed. In example embodiments, the upper surfaces of the bonding pads 136 may be coplanar with an upper surface of the passivation layer 138. The bonding pads 136 may electrically connect the through electrodes 110 to at least one of the first to fourth semiconductor chips 200, 300, 400, and 500. An upper surface of the base chip 100 on which the bonding pads 136 are disposed and facing the first semiconductor chip 200 may be referred to as a back surface BS of the base chip 100.

The first to fourth semiconductor chips 200, 300, 400, and 500 may be sequentially stacked on the back surface BS of the base chip 100. Referring further to FIG. 2, the first semiconductor chip 200 may include a semiconductor body 205, through electrodes 210, an internal circuit structure 220, an upper insulating layer 230, bonding pads 232, and a passivation layer 234. The semiconductor body 205 may include a semiconductor material such as a Group IV semiconductor, a Group III-V compound semiconductor, or a Group II-VI compound semiconductor. The through electrodes 210 may extend in a vertical direction, and may penetrate through the semiconductor body 205.

The internal circuit structure 220 may be disposed below the semiconductor body 205, and may be connected to the base back surface structure 130 of the base chip 100. The internal circuit structure 220 may include internal interconnections 222, a lower insulating layer 224, bonding pads 226, test pads TP, and a passivation layer 228. The internal interconnections 222 may be disposed in layers, and the through electrodes 210 may be electrically connected to at least one of the internal interconnections 222. In addition, the bonding pads 226 and the test pads TP may be electrically connected to at least one of the internal interconnections 222.

The lower insulating layer 224 may cover a lower surface of the semiconductor body 205 and the internal interconnections 222. The lower insulating layer 224 may also partially cover side surfaces of the through electrodes 210. The passivation layer 228 may be disposed below the lower insulating layer 224, and may cover a lower surface of the lower insulating layer 224. The bonding pads 226 and the test pads TP may be disposed below the lower insulating layer 224, and may be exposed without being completely covered by the passivation layer 228. For example, lower surfaces of the bonding pads 226 and the test pads TP may be coplanar with a lower surface of the passivation layer 228. The bonding pads 226 of the first semiconductor chip 200 may contact the bonding pads 136 of the base chip 100, and may electrically connect the base chip 100 to at least one of the internal interconnections 222. The test pads TP may contact the passivation layer 138 of the base chip 100, but may not be electrically connected to the base chip 100. The test pads TP may not contact the bonding pads 136 of the base chip 100.

The upper insulating layer 230, the bonding pads 232, and the passivation layer 234 may be disposed on the semiconductor body 205. The upper insulating layer 230 may cover an upper surface of the semiconductor body 205, and may partially cover side surfaces of the through electrode 210. The bonding pads 232 may be disposed on the upper insulating layer 230, and may be electrically connected to the through electrodes 210. The passivation layer 234 may cover the upper insulating layer 230, and may cover side surfaces of the bonding pads 232. The bonding pads 232 may not be completely covered by the passivation layer 234, and upper surfaces of the bonding pads 232 may be exposed. For example, the upper surfaces of the bonding pads 232 may be coplanar with an upper surface of the passivation layer 234.

The second and third semiconductor chips 300 and 400 may include the same components as those of the first semiconductor chip 200. For example, each of the second and third semiconductor chips 300 and 400 may include semiconductor bodies 305 and 405, through electrodes 310 and 410 penetrating through the semiconductor bodies 305 and 405, respectively, and test pads TP. The semiconductor bodies 305 and 405 may be substantially the same as the semiconductor body 205, and the through electrodes 310 and 410 may be substantially the same as the through electrodes 210. A detailed description of the second and third semiconductor chips 300 and 400 may be omitted.

The fourth semiconductor chip 500 may include a semiconductor body 505 and an internal circuit structure 520 disposed below the semiconductor body 505. The semiconductor body 505 of the fourth semiconductor chip 500 may include the same material as the semiconductor body 205 of the first semiconductor chip 200. The internal circuit structure 520 may include an internal interconnection 522, a lower insulating layer 524, bonding pads 526, test pads TP, and a passivation layer 528. The internal circuit structure 520 of the fourth semiconductor chip 500 may have substantially the same structure as that of the internal circuit structure 120 of the first semiconductor chip 200. The bonding pads 526 of the fourth semiconductor chip 500 may contact the bonding pads of the third semiconductor chip 400. The test pads TP of the fourth semiconductor chip 500 may contact the passivation layer of the third semiconductor chip 400. The test pads TP of the fourth semiconductor chip 500 may not contact the bonding pads of the third semiconductor chip 400.

Figure 3:
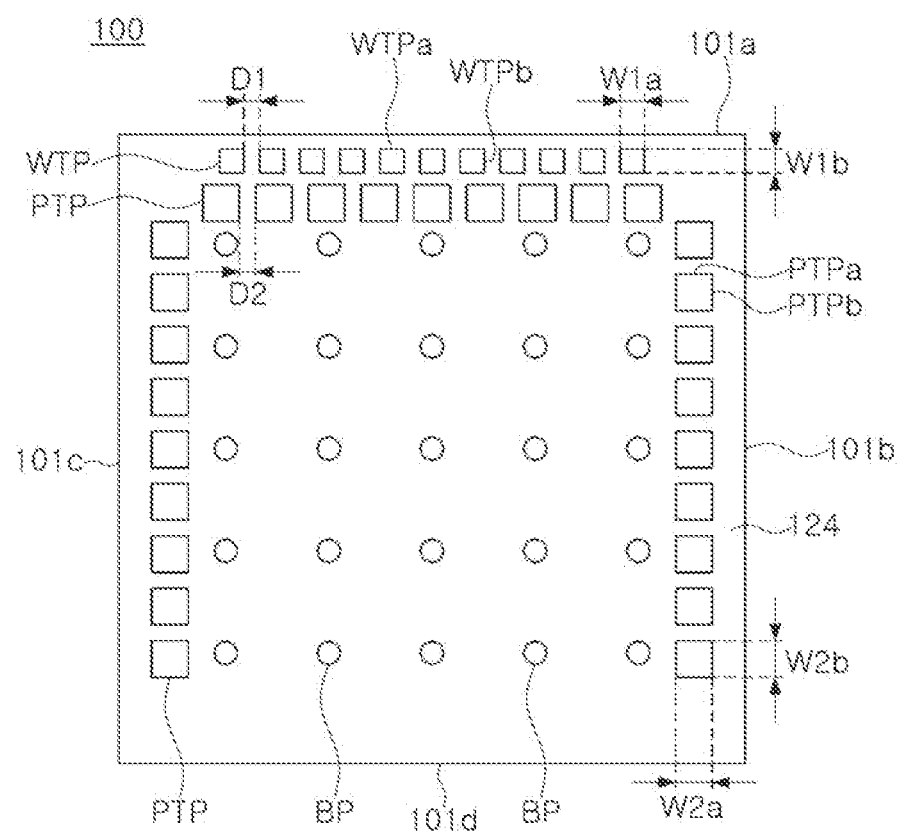
FIG. 3 is a plan view of the base chip shown in FIG. 1 viewed from below.

FIG. 3 is a plan view of the base chip illustrated in FIG. 1 viewed from below.

Referring to FIG. 3, bump pads BP, wafer test pads WTP, and package test pads PTP are disposed on a front surface FS of the base chip 100. When viewed in plan view, the bump pads BP may have circular shapes, and the wafer test pads WTP and package test pads PTP may have square or rectangular shapes. However, an example embodiment thereof is not limited thereto, and in some example embodiments, the wafer test pads WTP and the package test pads PTP may have a shape such as a triangle, a rhombus, a circle, or the like. As described above, the wafer test pad WTP and the package test pad PTP may be larger than the bump pad BP, and the wafer test pad WTP may be smaller than the package test pad PTP. For example, an area of the wafer test pad WTP may be smaller than an area of the package test pad PTP. For example, the wafer test pad WTP may have a first side surface WTPa having a first width W1a and a second side surface WTPb having a second width W1b, wherein the first width W1a may be about 40 μm to about 60 μm, and the second width W1b may be about 100 μm to about 150 μm. A distance D1 between adjacent wafer test pads WTP may be about 10 μm to about 30 μm. Here, the distance D1 between adjacent wafer test pads WTP may refer to a distance between opposite sides of the adjacent wafer test pads WTP. The package test pad PTP may have a first side surface PTPa having a first width W2a and a second side surface PTPb having a second width W2b, wherein the first width W2a may be about 65 μm to about 100 μm, and the second width W2b may be about 100 μm to about 150 μm. A distance D2 between adjacent package test pads PTP may be about 30 μm to about 50 μm. Here, the distance D2 between adjacent package test pads PTP may refer to a distance between opposite sides of the adjacent package test pads PTP.

In an example embodiment, the wafer test pads WTP and the package test pads PTP may be disposed along an edge of the base chip 100. For example, the base chip 100 may have first to fourth side surfaces 101a, 101b, 101c, and 101d, and the wafer test pads WTP and the package test pads PTP may be disposed in a row, respectively, along the first side surface 101a. For example, the package test pads PTP may be disposed in a row adjacent to the first side surface 101a, and the wafer test pads WTP may be disposed in another row adjacent to the first side surface 101a between the row of package test pads PTP and the first side surface 101a. In addition, the package test pads PTP may be disposed in a row along the second side surface 101b and in a row along the third side surface 101c. In an example embodiment, the wafer test pads WTP may be disposed farther from a central portion of the front surface FS of the base chip 100 than the package test pads PTP. For example, each of the wafer test pads WTP along (or adjacent to) the first side surface 101a may be disposed closer to the first side surface 101a than the package test pads PTP along (or adjacent to) the first side surface 101a.

The wafer test pads WTP according to example embodiments of the present disclosure may be formed to be smaller than the package test pads PTP, and as illustrated in FIG. 3, the wafer test pads WTP having the smaller size may be disposed to be closer to a side surface of the base chip 100 than the package test pads PTP. Therefore, the size of the base chip 100 may be reduced as compared to the case in which the wafer test pads WTP and the package test pads PTP are formed to have the same size, and the size of the semiconductor package 10 can be reduced. In addition, since the size of the wafer test pads WTP is reduced, space efficiency in which the test pads WTP and PTP are to be disposed increases, and the test pads WTP and PTP may be disposed in various manners. FIG. 3 is an exemplary layout diagram for illustrating wafer test pads WTP and package test pads PTP, but an example embodiment thereof is not limited thereto. In some example embodiments, various dispositional structures may be possible.

FIGS. 4A to 4D are partial plan views of a base chip viewed from below according to example embodiments. FIGS. 4A to 4D illustrate the partial region of FIG. 3.

Figure 4A:
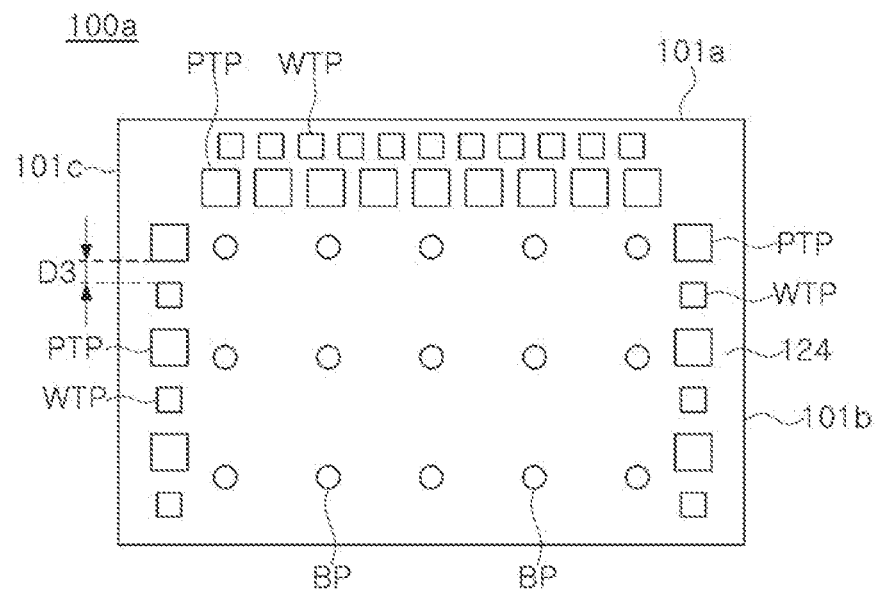
FIGS. 4A to 4D are partial enlarged views of a base chip according to example embodiments.

Referring to FIG. 4A, a base chip 100a according to an example embodiment may include wafer test pads WTP and package test pads PTP, alternately disposed. For example, the wafer test pads WTP and the package test pads PTP may be alternately disposed along the second side surface 101b of the base chip 100, and the wafer test pads WTP and the package test pads PTP may be alternately disposed along the third side surface 101c of the base chip 100. A distance D3 between adjacent wafer test pads WTP and package test pads PTP among the wafer test pads WTP and package test pads PTP, alternately disposed, may be equal to the distance D2. For example, the distance D3 between adjacent wafer test pads WTP and package test pads PTP may be 30 µm to 50 µm.

As illustrated in FIG. 4A, when the wafer test pads WTP and the package test pads PTP are alternately disposed, more test pads WTP and PTP may be disposed in the same space, as compared to the case in which the wafer test pads WTP and the package test pads PTP are formed to have the same size, and accordingly, the size of the semiconductor package 10 may be reduced.

Figure 4B:
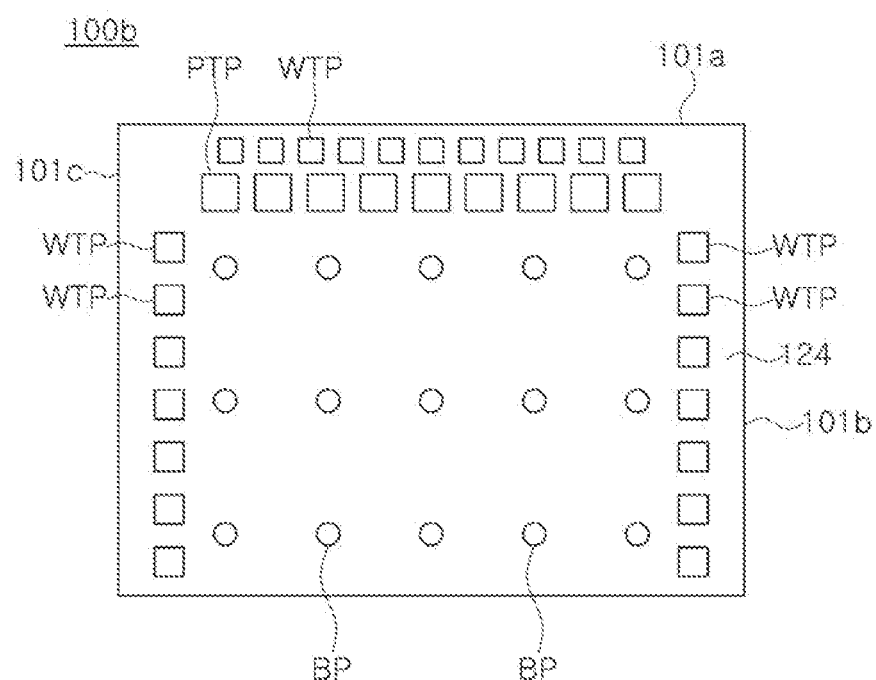

Referring to FIG. 4B, a base chip 100b according to an example embodiment may include wafer test pads WTP disposed along second and third side surfaces 101b and 101c of the base chip 100. Since the size of the wafer test pad WTP is smaller than that of the package test pad PTP, the size of the semiconductor package 10 may be reduced as compared to the case in which the package test pads PTP are disposed along the second and third side surfaces 101b and 101c.

Figure 4C:
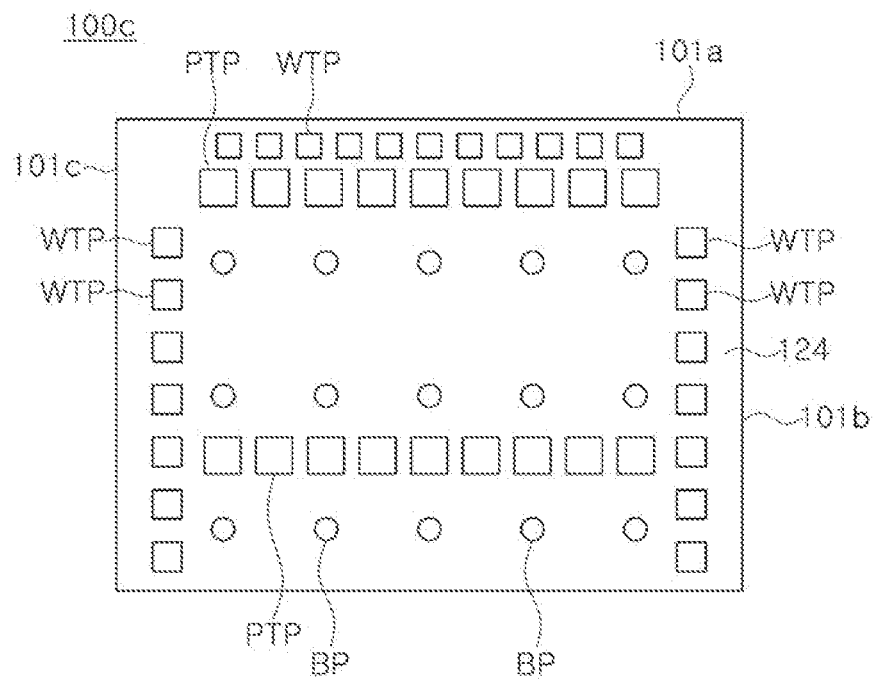

Referring to FIG. 4C, a base chip 100c according to an example embodiment may include package test pads PTP disposed between bump pads BP. For example, a second row of package test pads PTP may be disposed in parallel to the first side surface 101a and between bump pads BP.

Figure 4D:
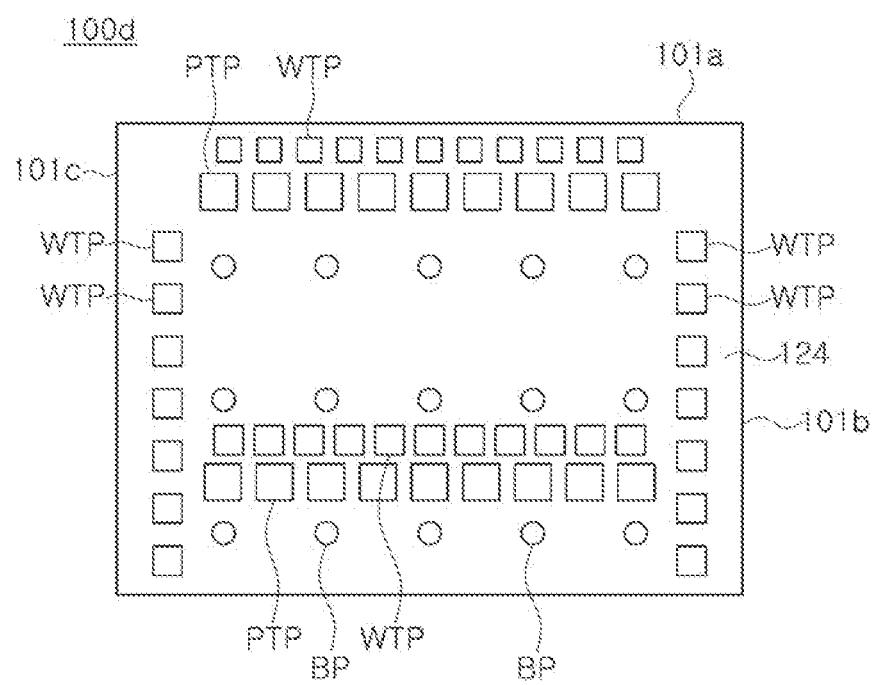

Referring to FIG. 4D, a base chip 100d according to an example embodiment may include wafer test pads WTP and package test pads PTP disposed between bump pads BP. The wafer test pads WTP and package test pads PTP may be disposed in a row, respectively. As illustrated in FIGS. 4C and 4D, the size of the semiconductor package may be reduced by disposing the wafer test pads WTP or the package test pads PTP between the bump pads BP.

Figure 5A:
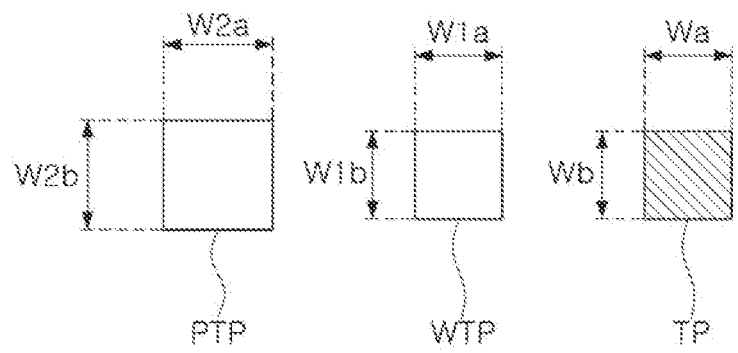
FIGS. 5A and 5B are schematic plan views illustrating test pads according to example embodiments.
Figure 5B:
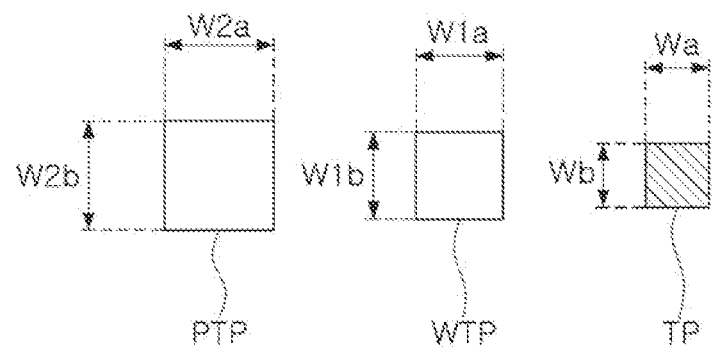

FIGS. 5A and 5B are schematic plan views illustrating test pads TP according to example embodiments.

FIGS. 5A and 5B illustrate a wafer test pad WTP and a package test pad PTP disposed on a front surface FS of a base chip 100 and a test pad TP disposed on lower surfaces of first to fourth semiconductor chips 200, 300, 400, and 500.

Referring to FIG. 5A, in an example embodiment, the wafer test pad WTP and the test pad TP may have the same size. In addition, as described above, the wafer test pad WTP of the present disclosure may be smaller than the package test pad PTP. For example, a first width W1a of the wafer test pad WTP may be smaller than a first width W2a of the package test pad PTP and/or a second width W1b of the wafer test pad WTP may be smaller than a second width W2b of the package test pad PTP.

Referring to FIG. 5B, in an example embodiment, the wafer test pad WTP may be larger than the test pad TP and smaller than the package test pad PTP. For example, the first width W1a of the wafer test pad WTP may be larger than the first width Wa of the test pad TP and/or the second width W1b of the wafer test pad WTP may be larger than the second width Wb of the test pad TP.

Figure 6:
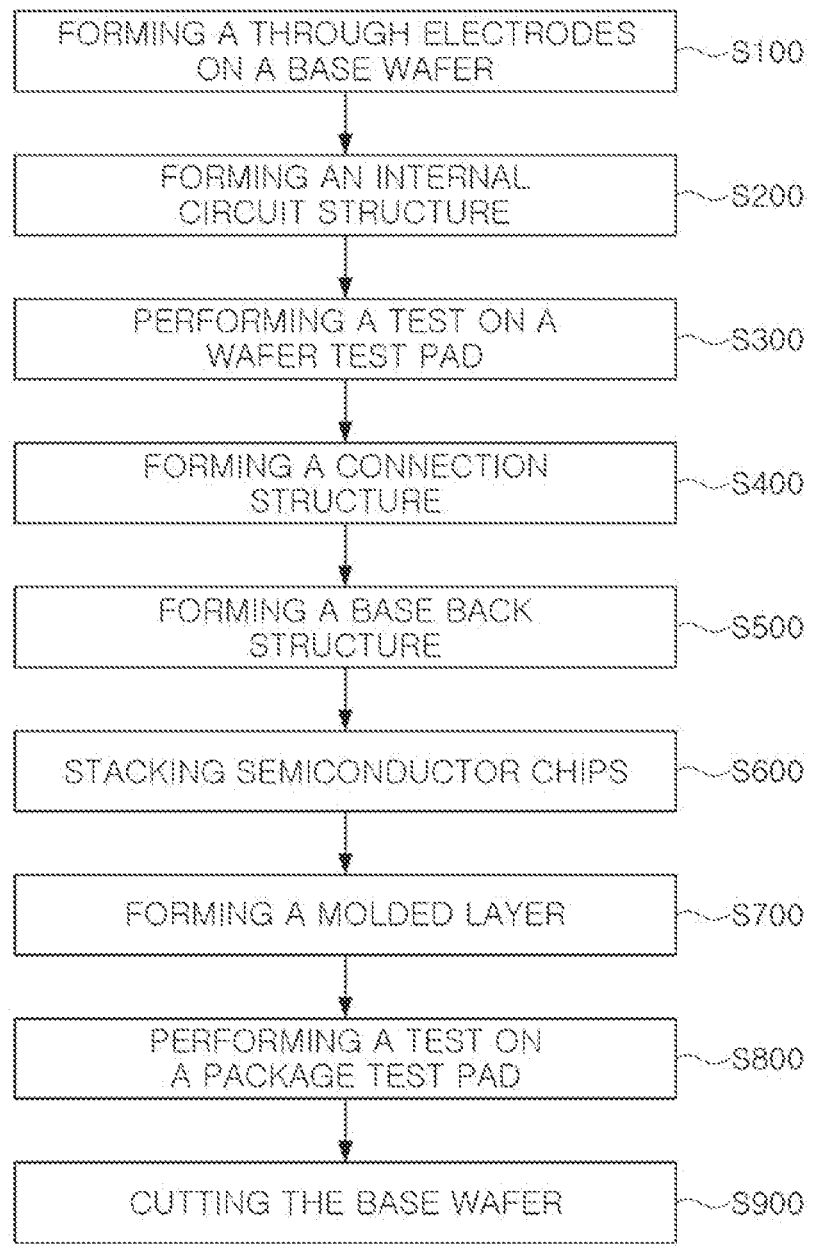
FIG. 6 is a flow chart illustrating a method of manufacturing a semiconductor package according to example embodiments.

FIG. 6 is a flow chart illustrating a method of manufacturing a semiconductor package according to example embodiments.

FIGS. 7 to 14 are cross-sectional views illustrating a method of manufacturing a semiconductor package according to a process sequence according to example embodiments.

Referring to FIGS. 6 to 14, a method of manufacturing a semiconductor package according to an embodiment of the present disclosure may include forming through electrodes 110 in a base wafer 104 (S100), forming an internal circuit structure 120 (S200), forming a connection structure 20 (S400), forming a base back structure 130 (S500), stacking semiconductor chips (S600), forming a molded layer M (S700), and cutting the base wafer 104 (S900). In addition, the method may further include forming an internal circuit structure 120 (S200), and then performing a test on wafer test pads WTP (S300), and forming a molded layer M (S700), and then performing a test on package test pads PTP (S800).

Figure 7:
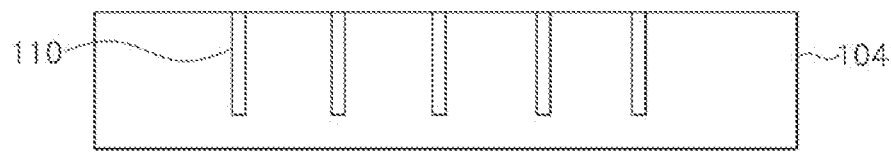
FIGS. 7 to 14 are cross-sectional views illustrating a method of manufacturing a semiconductor package according to a process sequence according to example embodiments.

Referring to FIG. 7, a base wafer 104 may be provided. The base wafer 104 may include a semiconductor material, such as a group IV semiconductor, a group III-V compound semiconductor, or a group II-VI compound semiconductor. For example, the group IV semiconductor may include silicon, germanium, or silicon-germanium. Thereafter, through electrodes 110 may be formed in the base wafer 104 (S100). Forming the through electrodes 110 may include forming a hole by etching one surface of the base wafer 104, forming an insulating material covering an inner wall of the hole, and forming a conductive material filling the hole. The through electrodes 110 may not completely penetrate through the base wafer 104.

Figure 8:
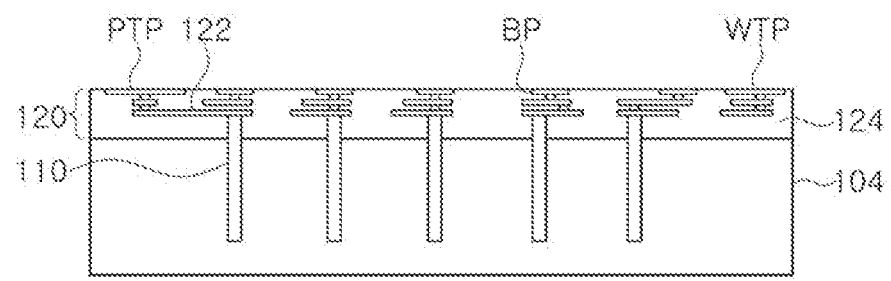

Referring to FIG. 8, an internal circuit structure 120 may be formed on the resulting structure of FIG. 7 (S200). For example, internal interconnections 122 electrically connected to the through electrodes 110 may be formed in a plurality of layers on the one surface of the base wafer 104, and the lower insulating layer 124 may be formed to cover the through electrodes 110 and the internal interconnections 122. FIG. 8 illustrates that an upper surface of the base wafer 104 is partially recessed, but an example embodiment thereof is not limited thereto. Although not illustrated, the internal circuit structure 120 may further include circuit elements electrically connected to the internal interconnections 122, and the circuit elements include active elements such as transistors and passive elements such as resistors and capacitors.

In addition, bump pads BP, wafer test pads WTP, and package test pads PTP electrically connected to the internal interconnections 122 may be formed. The wafer test pads WTP may be formed to be larger than the bump pads BP, and the package test pads PTP may be formed to be formed to be larger than the wafer test pads WTP. Each of the bump pads BP, the wafer test pads WTP, and the package test pads PTP may not be completely covered by the lower insulating layer 124, and at least an upper surface thereof may be exposed. The bump pads BP may be positioned at the same level as the wafer test pads WTP and the package test pads PTP.

At least one of the bump pads BP may be electrically connected to one of the through electrodes 110 through an internal interconnection 122. The wafer test pads WTP may be electrically connected to the internal interconnection 122. Each of the package test pads PTP may be electrically connected to one of the through electrodes 110 through the internal interconnection 122. The internal interconnections 122, the bump pads BP, the wafer test pads WTP, and the package test pads PTP may include a conductive material, such as copper (Cu), aluminum (Al), or silver. (Ag), tin (Sn), gold (Au), nickel (Ni), lead (Pb), titanium (Ti), or alloys thereof. The lower insulating layer 124 may include silicon oxide, silicon nitride, silicon oxynitride, or a combination thereof.

Figure 9:
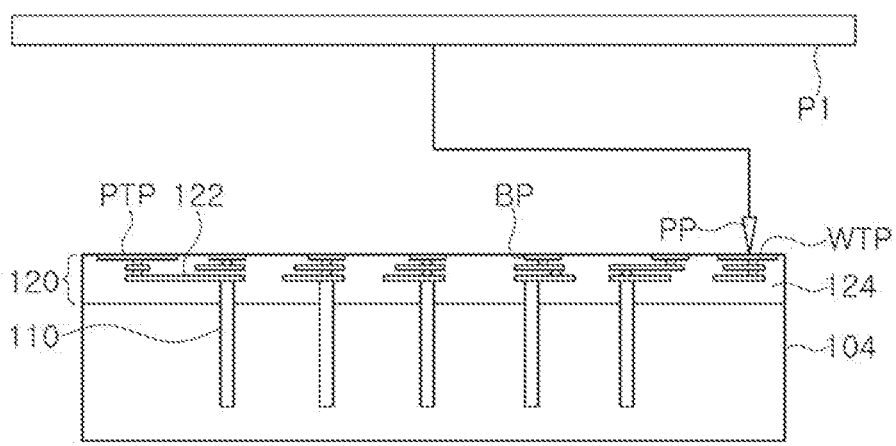

Referring to FIG. 9, a test may be performed on a wafer test pad WTP (S300). The test may be performed using a probe card P1. Since the wafer test pad WTP is electrically connected to internal interconnections 122 of the internal circuit structure 120, it is possible to determine whether the internal circuit structure 120 is defective by the test. For example, the internal circuit structure 120 may be tested by contacting a probe pin PP of the probe card P1 to the wafer test pad WTP to measure an electrical short circuit and leakage current of the internal interconnections 122. In example embodiments, the internal circuit structure 120 may be tested by contacting a plurality of probe pins PP of the probe card P1 to a plurality of wafer test pads WTP to measure an electrical short circuit and leakage current of the internal interconnections 122.

Figure 10:
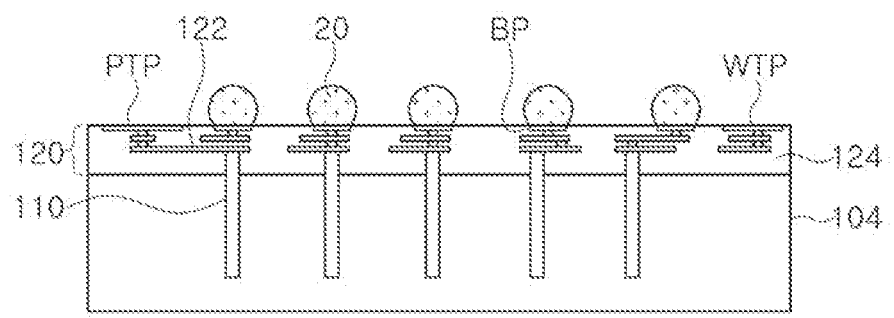

Referring to FIG. 10, connection structures 20 may be formed on an internal circuit structure 120 (S400). The connection structures 20 may be formed to contact bump pads BP, and may be electrically connected to the internal circuit structure 120 or the through electrodes 110 through the bump pads BP. The connection structures 20 may include tin (Sn) or an alloy (Sn—Ag—Cu) containing tin (Sn). In some example embodiments, after the connection structures 20 are formed, a test may be further performed on the wafer test pad WTP. The test may determine whether a defect has occurred in the internal circuit structure 120 in a process of forming the connection structures 20.

Figure 11:
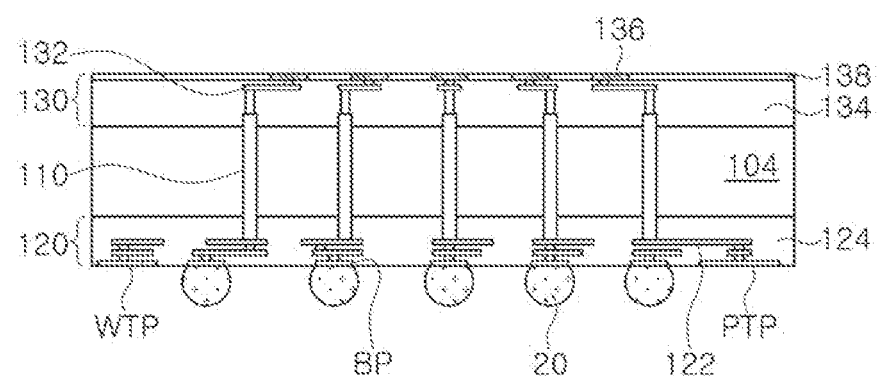

Referring to FIG. 11, a base back structure 130 may be formed by inverting the resulting structure of FIG. 10 (S500). The base back structure 130 may be located on an opposite side of a base wafer 104 to the internal circuit structure 120. Forming the base back structure 130 may include grinding the base wafer 104 to expose through electrodes 110. An internal interconnection 132 connected to the exposed through electrodes 110 and an upper insulating layer 134 covering the internal interconnection 132 may be formed, and bonding pads 136 and a passivation layer 138 may be formed on the upper insulating layer 134 to form a base back surface structure 130. Although a portion of the base wafer 104 is illustrated in FIG. 11 as being recessed, an example embodiment thereof is not limited thereto.

The internal interconnection 132 may be electrically connected to the through electrodes 110. The upper insulating layer 134 may cover the base wafer 104, the through electrodes 110, and the internal interconnection 132. The bonding pads 136 may be formed on the upper insulating layer 134 and may be electrically connected to the internal interconnection 132. The passivation layer 138 may be formed on the upper insulating layer 134, and may protect the upper insulating layer 134. The bonding pads 136 may not be covered by the passivation layer 138.

The internal interconnection 132 and the bonding pads 136 may include a conductive material, for example, copper (Cu), aluminum (Al), silver (Ag), tin (Sn), gold (Au), nickel (Ni), lead (Pb), titanium (Ti), or an alloy thereof. In an example embodiment, the bonding pads 136 may include copper (Cu). The upper insulating layer 134 may include silicon oxide, silicon nitride, silicon oxynitride, or a combination thereof, and the passivation layer 138 may include a thermosetting resin.

Figure 12:
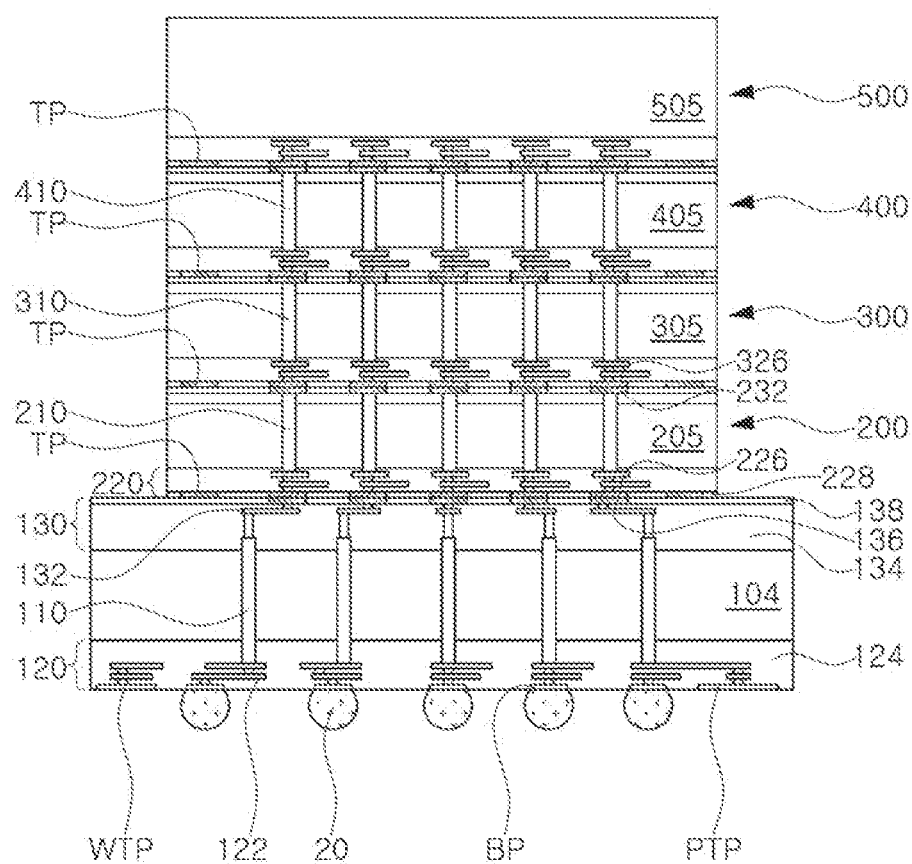

Referring to FIG. 12, semiconductor chips may be stacked on a base back surface structure 130 (S600). For example, first to fourth semiconductor chips 200, 300, 400, and 500 may be stacked on the base back surface structure 130. The base back structure 130 may contact and be coupled to an internal circuit structure 220 of the first semiconductor chip 200. For example, each of the bonding pads 136 of the base back surface structure 130 may contact and be coupled to a bonding pad 226 of the first semiconductor chip 200, and the passivation layer 138 of the base back surface structure 130 may contact and be coupled to a passivation layer 228 of the first semiconductor chip 200. The bonding pads 136 of the base back structure 130 may be electrically connected to the through electrodes 210 through the bonding pads 226 of the first semiconductor chip 200.

A second semiconductor chip 300 may be stacked on the first semiconductor chip 200. Each bonding pad 232 disposed above the first semiconductor chip 200 may contact and be coupled to a bonding pad 326 disposed below the second semiconductor chip 300. Thereafter, the third semiconductor chip 400 and the fourth semiconductor chip 500 may be sequentially stacked in the same manner. In an example embodiment of the present disclosure, each of the bonding pads is illustrated as directly contacting each other, but an example embodiment thereof is not limited thereto. In some example embodiments, bumps may be disposed between each of the bonding pads, and an adhesive material such as a non-conductive film (NCF) or a non-conductive paste (NCP) covering side surfaces of the bumps may be used to stack the first to fourth semiconductor chips 200, 300, 400, and 500.

Figure 13:
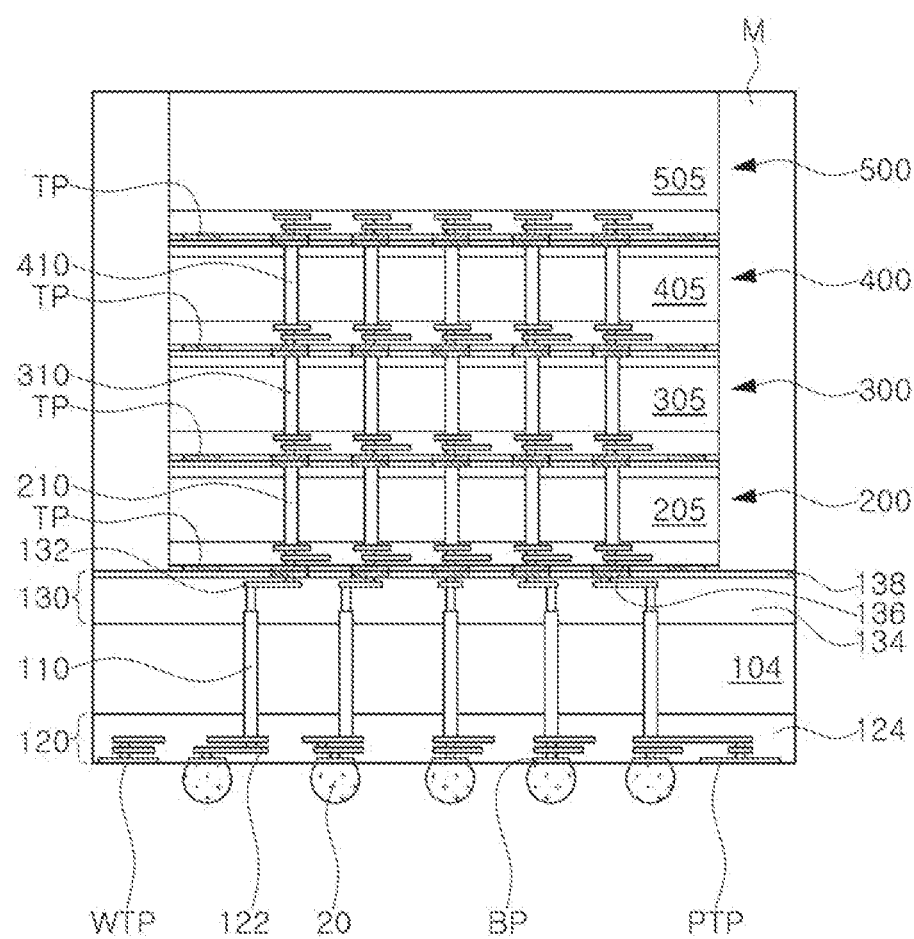

Referring to FIG. 13, a molded layer M may be formed (S700). The molded layer M may cover an upper surface of the base back surface structure 130 and side surfaces of the first to fourth semiconductor chips 200, 300, 400, and 500. In an example embodiment, after the molded layer M is formed to cover an upper surface of the fourth semiconductor chip 500, an upper portion of the molded layer M may be ground so that the upper surface of the fourth semiconductor chip 500 is exposed.

The molded layer M may be a resin including epoxy or polyimide. For example, the resin may be a bisphenol-group epoxy resin, a polycyclic aromatic epoxy resin, an o-Cresol novolac epoxy resin, a biphenyl epoxy resin, or a naphthalene-group epoxy resin.

Figure 14:
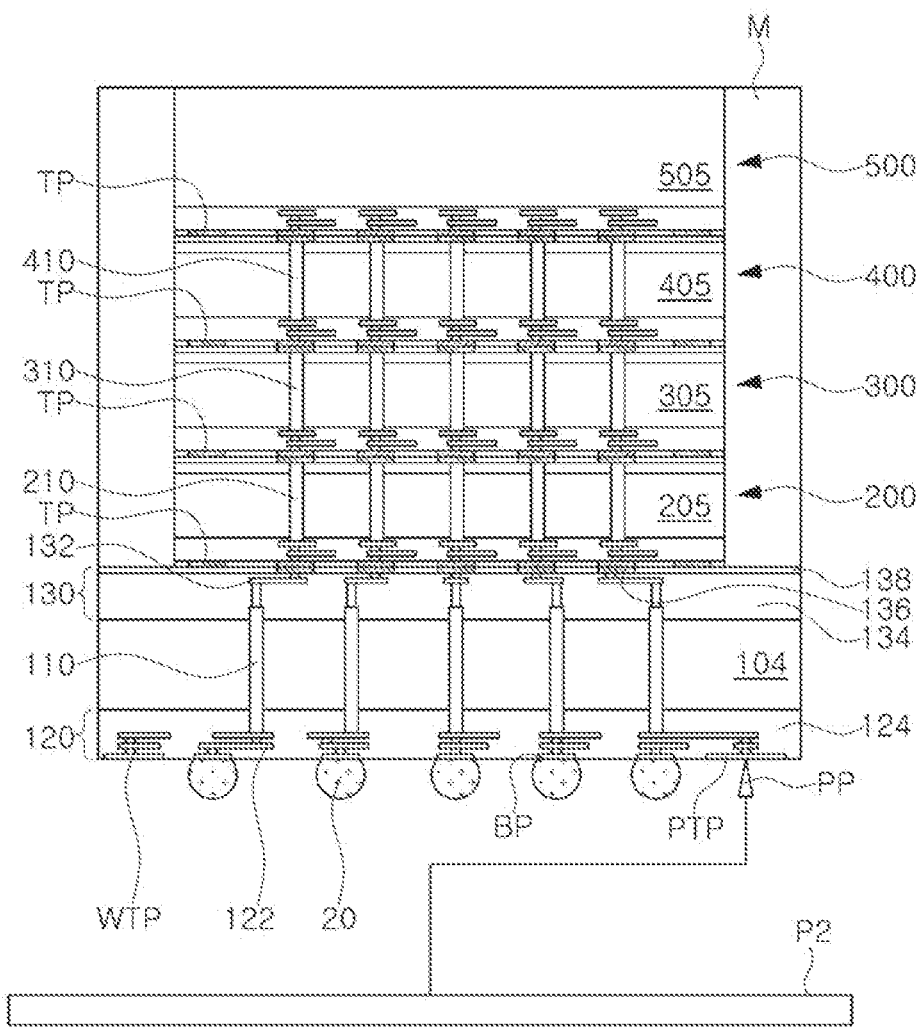

Referring to FIG. 14, a test may be performed on a package test pad PTP (S800). The test may be performed by contacting a probe pin PP of a probe card P2 to the package test pad PTP. The package test pad PTP may be electrically connected to at least one of first to fourth semiconductor chips 200, 300, 400, and 500 through the through electrodes 110 of the internal circuit structure 120. Therefore, it is possible to determine whether at least one of the first to fourth semiconductor chips 200, 300, 400, and 500 is defective by the test. In example embodiments, the first to fourth semiconductor chips 200, 300, 400, and 500 may be tested by contacting a plurality of probe pins PP to a plurality of package test pads PTP to determine whether at least one of the first to fourth semiconductor chips 200, 300, 400, and 500 is defective by the test. Since the package test pad PTP is formed relatively larger than the wafer test pad WTP, even if the base wafer 104 is contracted in a horizontal direction by heat in the operation of forming the molded layer M (S700), the package test pad PTP may contact the probe pin PP. Therefore, according to example embodiments of the present disclosure, contact defects between the probe pin PP and the package test pad PTP can be prevented.

Referring back to FIG. 1, a sawing process of cutting the base wafer 104 may proceed (S900). For example, the base wafer 104 together with the molded layer M may be cut, and the semiconductor package 10 illustrated in FIG. 1 may be formed. The cut and individualized base wafer 104 may be referred to as a base body 105, and the base body 105, the through electrodes 110, the internal circuit structure 120, and the base back structure 130 may form a base chip 100. In some example embodiments, after the base wafer 104 is cut, a test may be further performed on the package test pad PTP. The test may determine whether a defect has occurred in the first to fourth semiconductor chips 200, 300, 400, and 500 in the sawing process. The semiconductor package 10 may be mounted on the package substrate 12 through the connection structure 20.

As set forth above, according to example embodiments of the inventive concept, a wafer test pads may be formed to be smaller than a package test pad.

Therefore, contact defects between the test pad and a probe pin can be prevented, and a miniaturized semiconductor package may be provided.

While example embodiments have been shown and described above, it will be apparent to those skilled in the art that modifications and variations could be made without departing from the scope of the present inventive concept as defined by the appended claims.

What is claimed is:

1. A semiconductor package, comprising:
   a base chip having a front surface and a back surface opposite to the front surface, the base chip including bump pads, wafer test pads, and package test pads, disposed on the front surface thereof;
   connection structures disposed on the front surface of the base chip and connected to the bump pads; and
   semiconductor chips stacked on the back surface of the base chip,
   wherein each of the wafer test pads is smaller than the package test pads in size.

2. The semiconductor package of claim 1, wherein the base chip comprises
   a base body;
   through electrodes penetrating through the base body;
   an internal circuit structure disposed below the base body and including internal interconnections; and
   a base back structure disposed on the base body.

3. The semiconductor package of claim 2, wherein the wafer test pads are electrically connected to at least one of the internal interconnections, and the package test pads are electrically connected to at least one of the semiconductor chips through the through electrodes.

4. The semiconductor package of claim 1, wherein the wafer test pads are disposed farther than the package test pads with respect to a central portion of the front surface of the base chip.

5. The semiconductor package of claim 1, wherein a distance between one among the wafer test pads adjacent to a first side surface of the base chip and the first side surface is smaller than a distance between one of the package test pads adjacent to a second side surface of the base chip and the second side surface.

6. The semiconductor package of claim 1,
   wherein each of the wafer test pads comprises a first side surface having a first width and a second side surface having a second width,
   wherein the first width is about 40 µm to about 60 µm and the second width is about 100 µm to about 150 µm.

7. The semiconductor package of claim 1, wherein a distance between ones among the wafer test pads, adjacent to each other, is about 10 µm to about 30 µm.

8. The semiconductor package of claim 1,
   wherein each of the package test pads comprises a first side surface having a first width and a second side surface having a second width,
   wherein the first width is about 65 µm to about 100 µm and the second width is about 100 µm to about 150 µm.

9. The semiconductor package of claim 1, wherein a distance between adjacent ones among the package test pads is about 30 µm to about 50 µm.

10. The semiconductor package of claim 1,
    wherein the wafer test pads comprise first wafer test pads adjacent to a first side surface of the base chip,
    wherein the package test pads comprise first package test pads adjacent to the first side surface, and
    wherein each of the first wafer test pads is disposed closer to the first side surface than the first package test pads.

11. The semiconductor package of claim 10, wherein the first wafer test pads are disposed in a row along the first side surface, and the first package test pads are disposed in a row along the first side surface.

12. The semiconductor package of claim 1,
    wherein the wafer test pads comprise second wafer test pads adjacent to a second side surface of the base chip, and
    wherein the package test pads comprise second package test pads, adjacent to the second side surface,
    wherein the second wafer test pads and the second package test pads are alternately disposed.

13. The semiconductor package of claim 12, wherein a distance between adjacent ones among the second wafer test pads and the second package test pads is about 30 µm to about 50 µm.

14. The semiconductor package of claim 1, wherein package test pads comprise third package test pads disposed between the bump pads.

15. A semiconductor package, comprising:
    a base chip having a front surface and a back surface opposite to the front surface, the base chip including bump pads, wafer test pads, and package test pads, disposed on the front surface thereof;
    connection structures disposed on the front surface of the base chip and connected to the bump pads; and
    semiconductor chips stacked on the back surface of the base chip and including test pads,
    wherein each of the wafer test pads is smaller than the package test pads and larger than or equal to the test pads in size.

16. The semiconductor package of claim 15, wherein the base chip comprises
- a base body;
- through electrodes penetrating through the base body;
- an internal circuit structure disposed below the base body and including internal interconnections; and
- a base back structure disposed on the base body.

17. The semiconductor package of claim 16, wherein the wafer test pads are electrically connected to at least one of the internal interconnections, and the package test pads are electrically connected to at least one of the semiconductor chips through the through electrodes.

18. The semiconductor package of claim 16,
- wherein the semiconductor chips comprise a first semiconductor chip in contact with the base chip, and
- wherein a test pad of the first semiconductor chip is disposed on a lower surface of the first semiconductor chip and is in contact with a passivation layer of the base back structure.

19. A semiconductor package, comprising:
- a base chip having a front surface and a back surface opposite to the front surface, the base chip including: a base body; through electrodes penetrating through the base body; an internal circuit structure disposed below the base body and including internal interconnections; and a base back structure disposed on the base body;
- semiconductor chips stacked on the back surface of the base chip;
- connection structures disposed on the front surface of the base chip; and
- a molded layer covering the base chip and the semiconductor chips,
- wherein the internal circuit structure includes bump pads disposed on the front surface, wafer test pads electrically connected to at least one of the internal interconnections, and package test pads electrically connected to at least one of the semiconductor chips,
- wherein each of the wafer test pads is smaller than the package test pads.

20. The semiconductor package of claim 19, wherein a distance between the wafer test pads is smaller than a distance between the package test pads.

* * * * *